United States Patent [19]
Takagi et al.

[11] Patent Number: 5,469,260
[45] Date of Patent: Nov. 21, 1995

[54] STAGE-POSITION MEASURING APPARATUS

[75] Inventors: Shinichi Takagi; Kenji Nishi, both of Kawasaki, Japan

[73] Assignee: Nikon Corporation, Tokyo, Japan

[21] Appl. No.: 280,542

[22] Filed: Jul. 26, 1994

Related U.S. Application Data

[63] Continuation of Ser. No. 37,401, Mar. 26, 1993, abandoned.

[30]  Foreign Application Priority Data

Apr. 1, 1992 [JP] Japan .................................. 4-079594
Jul. 30, 1992 [JP] Japan .................................. 4-203432

[51] Int. Cl.⁶ .............................. G01B 9/02; G01B 11/10; G01N 21/86
[52] U.S. Cl. .......................... 356/358; 356/400; 356/357; 356/345; 359/859
[58] Field of Search ..................................... 356/358, 363, 356/345, 357, 400, 401; 250/548; 359/859

[56] References Cited

U.S. PATENT DOCUMENTS

| | | | |
|---|---|---|---|
| 3,970,389 | 7/1976 | Mendrin et al. ........................ | 356/4.5 |
| 4,643,577 | 2/1987 | Röth et al. ............................... | 356/358 |
| 4,814,625 | 3/1989 | Yabu ........................................ | 250/548 |
| 4,958,082 | 9/1990 | Makinouchi et al. ................... | 250/548 |
| 4,984,891 | 1/1991 | Miyazaki et al. ....................... | 356/358 |
| 5,141,318 | 8/1992 | Miyazaki et al. ....................... | 356/358 |
| 5,151,749 | 9/1992 | Tanimoto et al. ....................... | 356/358 |
| 5,151,750 | 9/1992 | Magome et al. ........................ | 356/401 |
| 5,243,195 | 9/1993 | Nishi ....................................... | 356/401 |

Primary Examiner—Robert P. Limanek
Assistant Examiner—Alexander Oscar Williams
Attorney, Agent, or Firm—Shapiro and Shapiro

[57] ABSTRACT

An apparatus for measuring the position of a movable stage by the use of a laser interferometer is of a construction in which covers are provided on respective ones of a beam optical path for reference travelling toward a fixed mirror in the laser interferometer and a beam optical path for measurement travelling toward a movable mirror and temperature-controlled gas is supplied into the covers.

7 Claims, 12 Drawing Sheets

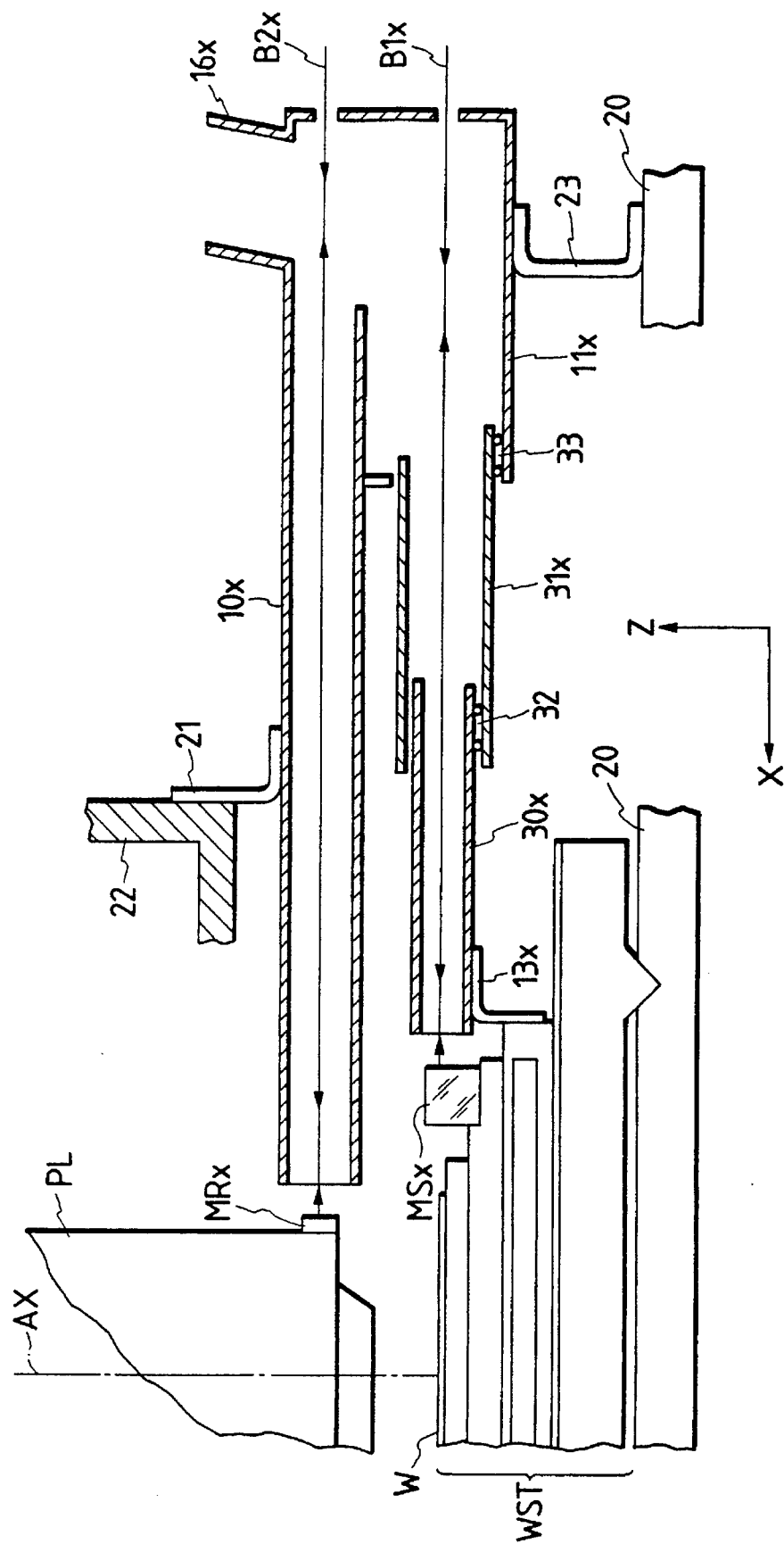

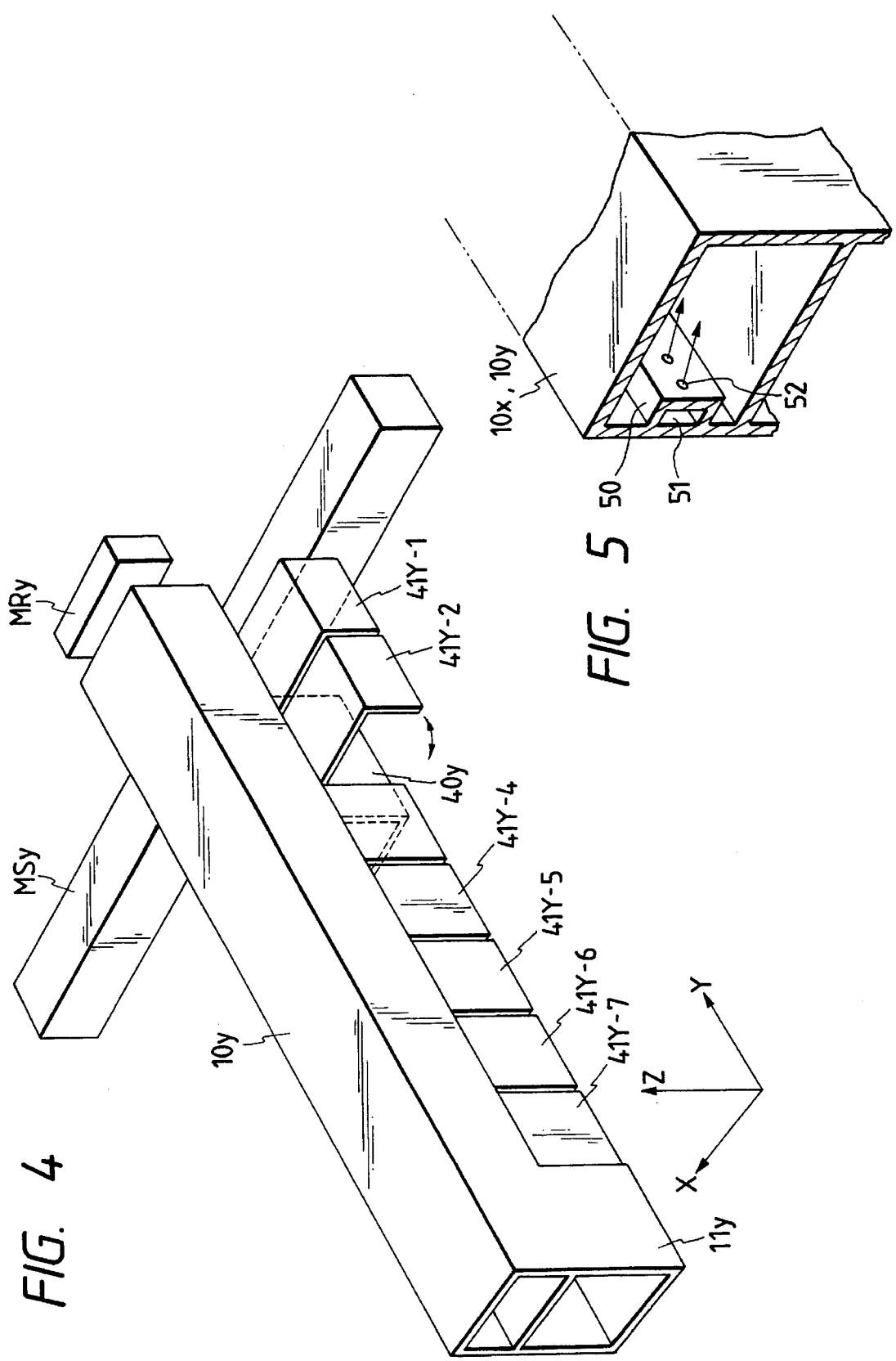

STAGE-POSITION MEASURING APPARATUS

This is a continuation of application Ser. No. 08/037,401 filed Mar. 26, 1993, now abandoned.

BACKGROUND OF THE INVENTION

1. Field of the Invention

This invention relates to an apparatus for measuring the position of a one-dimensionally or two-dimensionally moved stage by the use of a light wave interferometer.

2. Related Background Art

It is a well-known technique to measure the position of a movable stage by the use of a light wave interferometer (generally a laser interferometer). Of light wave interferometers, an intensity modulation type interferometer causes a frequency-stabilized coherent laser beam (parallel light beam) to enter a movable mirror mounted on a movable member, perpendicularly to the movable mirror and also causes a laser beam (parallel light beam) to enter a fixed mirror mounted on a portion fixedly connected to the base portion of a stage, perpendicularly to the fixed mirror, and causes the beams reflected by the movable mirror and the fixed mirror to interfere with each other and photoelectrically detects any variation in the interference fringes thereof. Accordingly, when the stage is moved, the light and shade of the fringes vary repetitively in accordance with the wavelength of the laser beam and the amount of movement, and a photoelectric signal (of a sine wave shape) obtained at this time is converted into a digital pulse, which is measured by a counter to thereby find the position of the stage. A frequency modulation type interferometer is also known, and this endows laser beams travelling toward a movable mirror and a fixed mirror with a predetermined frequency difference, causes reflected beams from the movable mirror and the fixed mirror to interfere with each other and measures the amount of movement of a stage from the transition of the phase of a beat signal (difference frequency) obtained when the interference is photoelectrically detected.

An example of an exposing apparatus provided with a stage measured by a light wave interferometer will now be described with reference to FIG. 14 of the accompanying drawings. FIG. 14 shows an exposing apparatus of the step and repeat type or the step and scan type, and a reticle R having the original picture of a circuit pattern depicted thereon is uniformly illuminated by exposure light from an illuminating system ILS for exposure while it is held on a reticle stage RST. The pattern of the reticle R is imaged and projected onto a wafer W having a photosensitive agent applied thereto, through a projection optical system PL. The wafer W is placed on a wafer stage WST two-dimensionally movable in a plane perpendicular to the optical axis AX of the projection optical system PL. The wafer stage WST is moved on a base in the left to right direction in FIG. 14 and a direction perpendicular to the plane of the drawing sheet of FIG. 14. Although not shown in FIG. 14, the reticle stage RST and the projection optical system PL are mounted on a column which is integral with the base portion of the wafer stage WST.

As shown in FIG. 14, one (or more) beam from a laser interferometer (including a laser source) IFM is transmitted through a beam splitter BS and is projected onto a movable mirror MS fixed to the wafer stage WST, and another beam from the IFM is reflected by the beam splitter BS and is projected onto a fixed mirror (reference mirror) MR fixed to the lower portion of the lens barrel of the projection optical system PL. The movable mirror MS is a mirror to be measured when the wafer stage WST is moved in the left to right direction in FIG. 14, and the reflecting surface of the movable mirror MS is formed elongately in a direction perpendicular to the plane of the drawing sheet of FIG. 14.

Also, the interferometer IFM combines the reflected-beam from the fixed mirror MR and the reflected beam from the movable mirror MS by the beam splitter BS and causes them to interfere with each other, and includes a photoelectric detector for receiving the interference beam and a pulse converter for outputting an up-down pulse on the basis of the photoelectric signal thereof. The up-down pulse from this pulse converter is reversibly counted by an up-down counter in a stage control system STD, and the position of the wafer stage WST is measured.

Further, the stage control system STD suitably controls the output signal to a motor MT for driving the wafer stage WST, in conformity with the measured position by the up-down counter. When it receives a positioning target value (coordinates value) output from a main control system MCS, the stage control system STD moves the wafer stage WST so that the current position of the wafer stage WST detected by the interferometer IFM and counted by the up-down counter may coincide with said target value within a predetermined tolerance.

Also, the exposing apparatus of this kind is provided with a TTR (through-the-reticle) type alignment system AA1 for effecting the alignment of the reticle R relative to the optical axis AX of the projection optical system PL and effecting the alignment of the wafer W and the reticle R through the projection optical system PL, or a TTL (through-the-lens) type alignment system AA2 for aligning the wafer W through the projection optical system PL. Various types of alignment information by these alignment systems AA1 and AA2 is sent to the main control system MCS and is used to calculate a target value for the accurate positioning of the wafer stage WST.

The wafer stage WST shown in FIG. 14 generally has a movement stroke of the order of 30 cm–50 cm. However, in an exposing apparatus for a liquid crystal panel, the size of a plate as a member to be exposed and therefore, in some cases, the movement stroke amounts to the order of 80 cm. Therefore, the beam optical path from the interferometer IFM and the beam splitter BS fixed on the base side to the movable mirror MS need be long correspondingly thereto. In accordance therewith, the distance of the beam optical path to the fixed mirror MR is also determined.

Now, in the measurement using the interferometer IFM, the wavelength of the laser beam is the reference of the measurement. The actual length of a wavelength of a beam varies depending on the refractive index of a medium through which the beam propagates. Accordingly, when the atmospheric pressure varies, the refractive index of the atmosphere also varies in conformity therewith and therefore, in the laser interferometer of this kind, provision is made of an automatic wavelength compensating mechanism for detecting any variation in the atmospheric pressure by a sensor and it is practiced to correct a constant for converting a wavelength of the beam into an actual dimensional value in the order of ppm.

However, the atmosphere in the beam optical path does not cause a variation in refractive index uniformly everywhere, but when a variation in refractive index occurs locally in the beam optical path, it appears as the fluctuation of the measured value by the interferometer. For example, if a gas having a temperature difference with respect to the ambient temperature slowly crosses the beam optical path, the measured value (the value of the counter) will vary unstably within a certain range in spite of the wafer stage WST being properly stationary. When as an example, the minimum resolving power of the interferometer is 0.01 μm, the amount of fluctuation by the gas having the temperature difference which slowly crosses the beam optical path may amount to the order of ±0.1 μm in the worst case. This is 0.2 μm as the fluctuation width and therefore is a value which will not stand the practical use as an apparatus for exposing a pattern of line width of the order of 0.5 μm.

The influence of this fluctuation will pose problems in two cases. One of them is that a random error included in the measured value of the position during various kinds of alignment using a laser interferometer becomes great and the reproducibility of alignment is aggravated. The other problem is that when the wafer stage WST is made stationary by servo control so that the measured value by the interferometer may become a constant value, the wafer stage WST follows by a minute amount and is not accurately stationary. This appears as a thickening of the line width and as a bad resolution when the pattern of the reticle R is exposed on the wafer W. Although the resolving power may be increased by the projection optical system and the illuminating system, the best use, however, will not be made of it.

Also, a component of a relatively short period (10 Hz or more) and a component of a long period (less than 10 Hz) are mixedly present in the localized variation in the refractive index of the gas in the beam optical path, and of these components, the fluctuation of a low frequency component of 1 Hz to several Hz will particularly pose a problem. This is because a high fluctuation component of several Hz or more can be substantially neglected by reading the value of the counter of the interferometer by a computer or the like a plurality of times at very short sampling intervals (e.g. of the order of 1 msec.), and averaging those values. So, it has heretofore been proposed to reduce the fluctuation of the low frequency component by the technique of positively supplying gas (air) to the beam optical path or covering the beam optical path with a cover member.

As techniques heretofore proposed, U.S. Pat. No. 5,141,318 discloses providing an air duct for blowing out gas (clean air) perpendicularly to the beam optical path of a laser interferometer, and U.S. Pat. No. 4,814,625 discloses providing such air duct in parallelism to the beam optical path. However, where gas in blown out in parallelism to the beam optical path, the blast nozzle of the air duct need be disposed rearwardly of or near the laser interferometer and be turned to the movable mirror of a stage. In this case, if the stage is at a position farthest from the laser interferometer, the gas near the movable mirror will hardly become parallel to the beam optical path and become a turbulent flow of small flow velocity, and there may occur a convection with a laser source or the like for the laser interferometer as a heat generating source. This convection itself will not so much affect the measurement by the laser interferometer. This is because an exposing apparatus of this kind is originally preserved at a constant temperature (e.g. 23±0.1° C.) within an environmental chamber and therefore the influence of the convection is reduced by the temperature control of the chamber.

On the other hand, where gas is flowed from obliquely above perpendicularly to the beam optical path, the blast nozzle for the gas must be disposed along the beam optical path. Again in this case, the problem of convection may likewise arise, but the influence thereof is little because the apparatus itself is preserved within the chamber as described above. However, in a position wherein the stage becomes closest to the laser interferometer, the gas from the blast nozzle is directly blown upon a wafer or the like on the stage.

Where as described above, the gas is blown from a direction parallel to or perpendicular to the beam optical path, a blast nozzle is simply provided in a free space and therefore, the flow of the gas cannot be accurately controlled and the creation of dust by the creation of a turbulent flow or the like has also posed a problem. Particularly in the exposing apparatus of this kind, the preservation space therefor is controlled to class 10 (less than ten pieces of dust in 1 m$^3$). Accordingly, the air in the chamber containing the exposing apparatus therein is also cleaned so as to ensure class 10 or class 100.

However, the beam optical path of the laser interferometer generally lies in the lower portion of the apparatus and therefore, if the blast nozzle is simply turned to the optical path, there may arise the problem that dust (oil mist, metal powder or the like of micron size) created in the movable portion or the frictional portion of the stage or the like by a convection (a turbulent flow) is blown up to above the stage and will soon adhere onto a wafer. Also, to give a blast to the whole optical path, an air conditioning mechanism of large capacity has been necessary and large-scale facilities including a duct mechanism had to be adopted.

On the other hand, it is also a technique effective against fluctuation to cover the beam optical path with a retractile pipe or the like, but if the beam optical path is simply covered with such a pipe, the air in the pipe may stagnate or a relatively great variation in the density of the air in the pipe, i.e., a variation in refractive index, may be caused by the expansion and contraction of the pipe resulting from the movement of the stage. There is also the inconvenience that the retractile mechanism makes the apparatus large in scale.

SUMMARY OF THE INVENTION

The present invention has been made in view of the above-noted points and the object thereof is to provide an apparatus which simply enables stable measurement to be accomplished by an interferometer.

To solve the above-noted problems, in the present invention, a beam optical path for reference travelling toward a fixed mirror and/or a beam optical path for measurement travelling toward a movable mirror is covered with cover means (a fixed cover 10x, 10y, movable covers 12x, 12y, 30x, 30y, 31x, 31y, 40x, 40y, etc.) and temperature-controlled gas (temperature-controlled air) is supplied to the interiors of these cover means.

Also, provision is made of first cover means (10x, 10y) for covering the beam optical path from the interferometer to the fixed mirror, second cover means (12x, 12y) for covering only a part of the beam optical path from the interferometer to the movable mirror which is near the movable mirror, and gas supplying means (15x, 15y, 16x, 16y) for supplying gas of a controlled temperature at a predetermined flow rate to the interiors of the first cover means and the second cover means, and particularly the gas of a temperature controlled in the second cover means is flowed from the movable mirror to the interferometer.

In the present invention, the beam optical path of the interferometer is covered with a cover and at the same time, temperature-controlled air is flowed into the cover and therefore, even if the quantity of supplied gas is smaller than in the prior art, the flow velocity of the gas near each beam becomes great and a low frequency component which becomes the greatest cause of fluctuation becomes substantially null. Also, only a part of the beam optical path from the interferometer to the movable mirror which is near the movable mirror particularly greatly affected by fluctuation is covered with a cover, and temperature-controlled air is flowed from the movable mirror toward the interferometer and therefore, the apparatus becomes compact and moreover, the fluctuation of the low frequency component becomes substantially null.

As described above, according to the present invention, the beam optical path of the light wave interferometer can be reliably air-conditioned and therefore, the measurement error by the fluctuation of the air is reduced and the position of a stage is measured stably and with good reproducibility. According to experiments, the measurement error by the fluctuation before the cover means (cover) is provided has been of the order of ±0.04 µm, whereas when a cover is provided and the interior thereof is air-conditioned, the error by the fluctuation can be reduced to the order of ±0.01 µm.

Also, since only a part of the beam optical path from the interferometer to the movable mirror which is near the movable mirror particularly greatly affected by the fluctuation is covered with a cover and temperature-controlled air is flowed from the movable mirror toward the interferometer, the apparatus is not made bulky and complicated and moreover, the fluctuation of the low frequency component becomes substantially null.

BRIEF DESCRIPTION OF THE DRAWINGS

FIG. 3 is a fragmentary cross-sectional view showing the structure of the optical path cover of a light wave interferometer according to a second embodiment of the present invention.

FIG. 4 is a perspective view showing the structure of the optical path cover of a light wave interferometer according to a third embodiment of the present invention.

FIG. 5 is a perspective view showing a modification of the jet structure of temperature-controlled air in a fixed cover.

DESCRIPTION OF THE PREFERRED EMBODIMENTS

Figure 1:
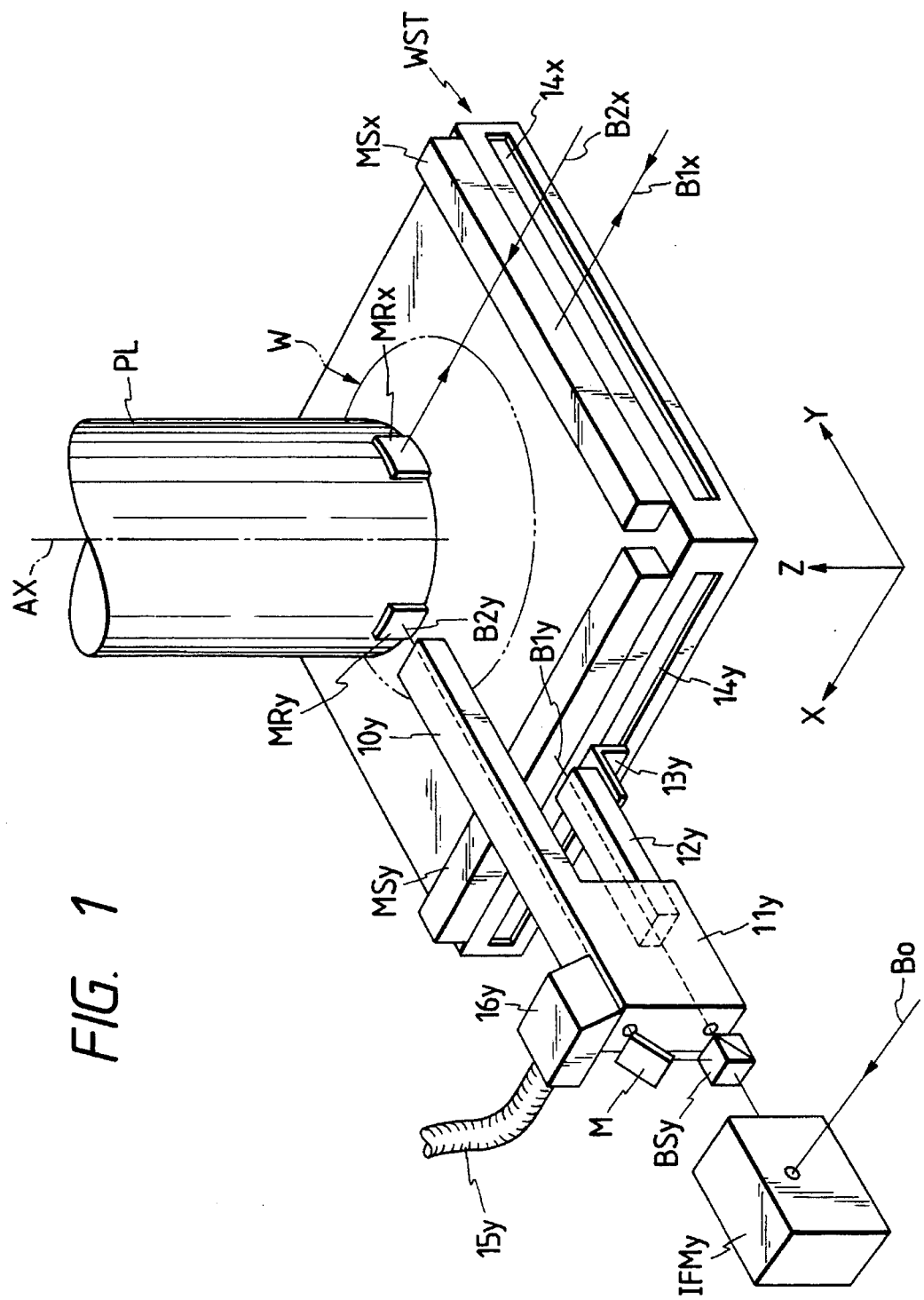
FIG. 1 is a perspective view showing the construction of a stage provided with a light wave interferometer according to a first embodiment of the present invention.
Figure 2:
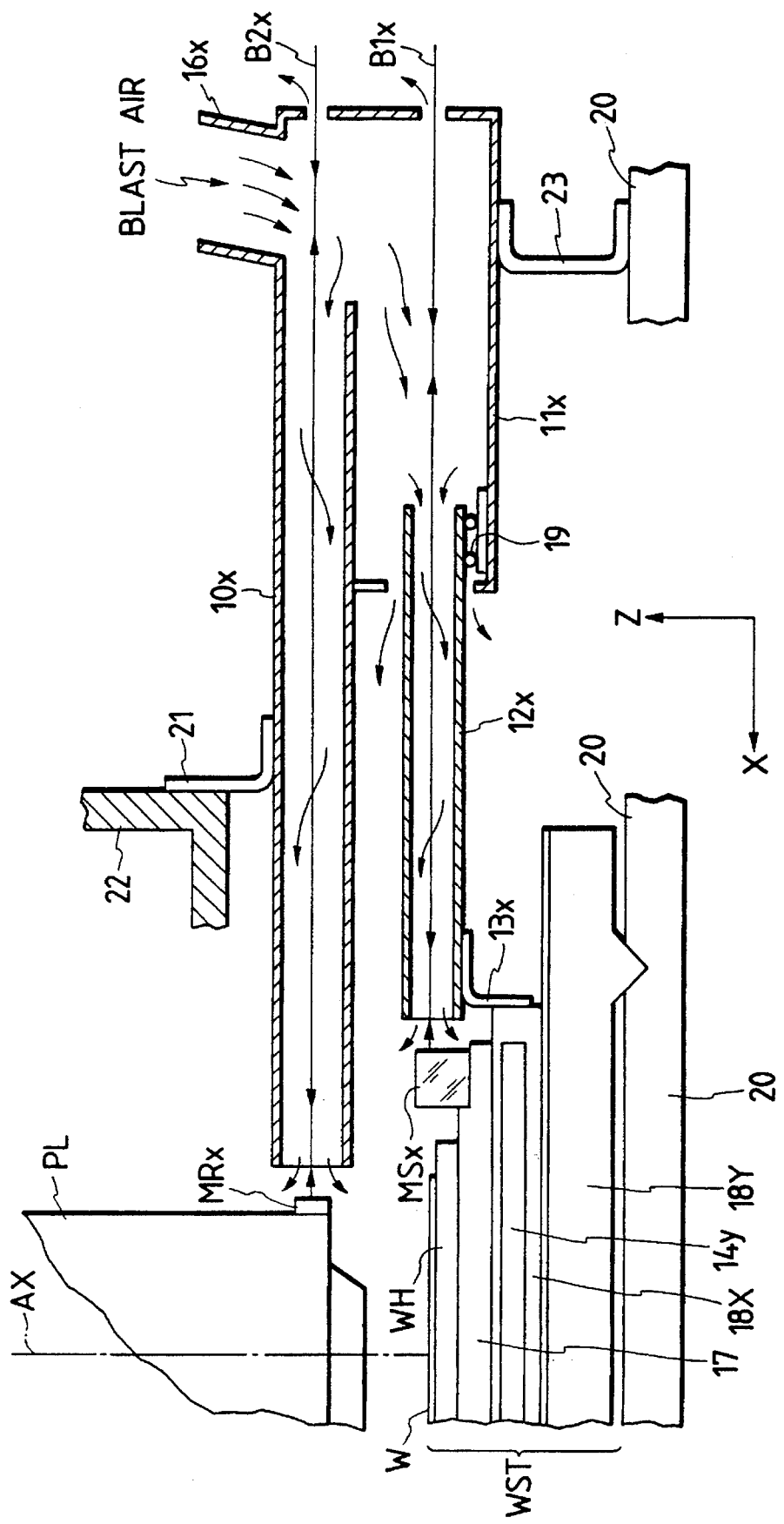
FIG. 2 is a fragmentary cross-sectional view showing the structure of the optical path cover of the light wave interferometer of FIG. 2.
Figure 14:
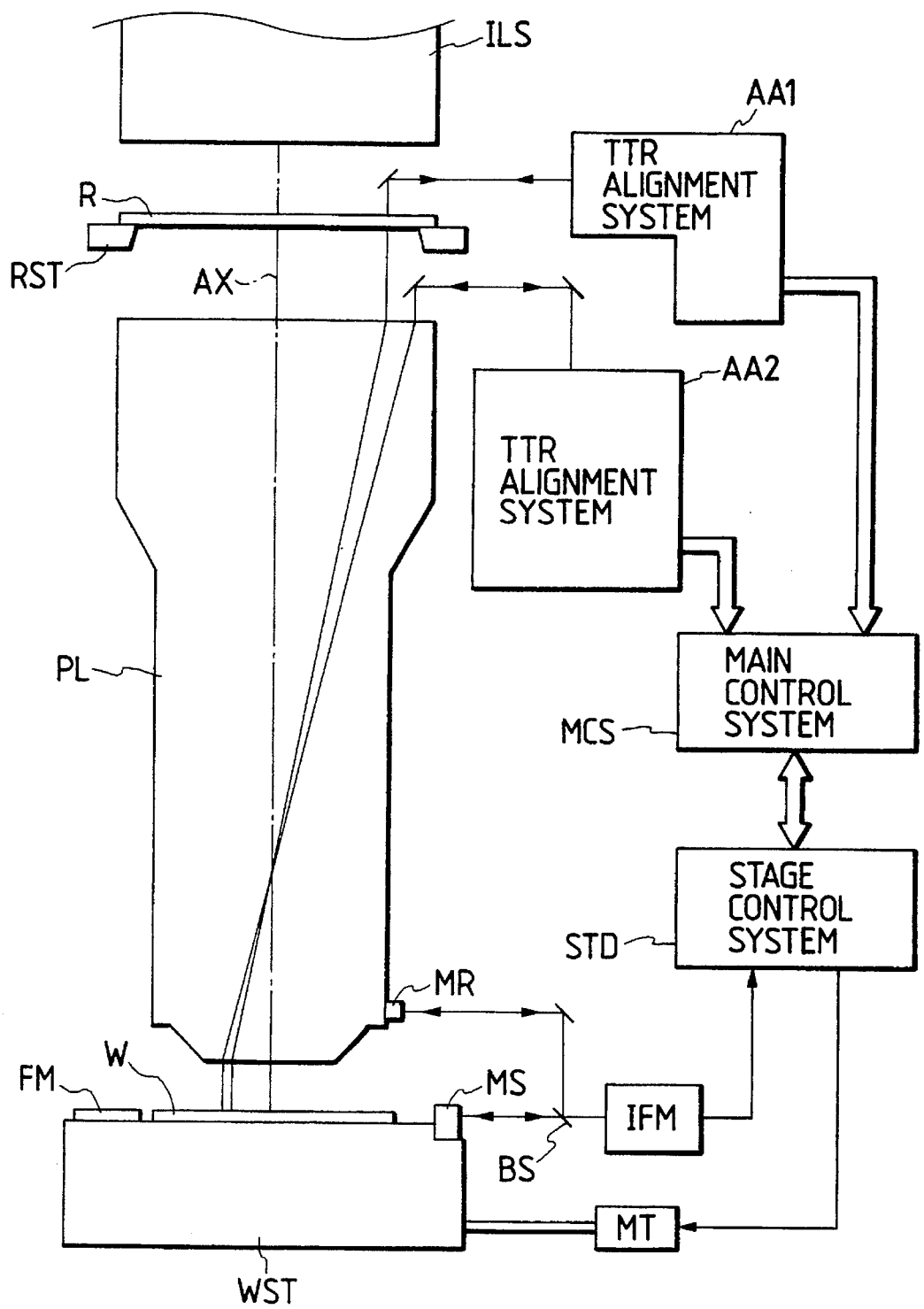
FIG. 14 shows the construction of a projection exposing apparatus according to the prior art.

FIG. 1 shows the structure of a position measuring apparatus according to a first embodiment of the present invention when it is applied to an exposing apparatus similar to that shown in FIG. 14. In FIG. 1, members functionally similar to those in FIG. 14 are given similar reference characters. Although not shown in FIG. 14, a wafer stage WST is two-dimensionally translated in a predetermined orthogonal coordinates system XY and therefore, laser interferometers for position measurement are provided with respect to the directions of movement axes X and Y. In FIG. 1, a laser interferometer IFMy for Y-axis and the optical path thereof are shown in detail and an interferometer (IFMx) for X-axis is not shown because it is of the same construction as the interferometer for Y-axis. However, beams B1x and B2x travelling toward a movable mirror MSx and a fixed mirror MRx for X-axis, respectively, are shown in FIG. 1. It is to be understood here that as shown in FIG. 2, an orthogonal coordinates system XYZ are defined, the optical axis AX of a projection optical system PL is parallel to Z-axis, the reflecting surfaces of the movable mirror MSx and fixed mirror MRx are disposed so as to be parallel to Y–Z plane and the reflecting surfaces of a movable mirror MSy and fixed mirror MRy are disposed so as to be parallel to X–Z plane. Also, a beam from a laser source for the interferometer is designated by Bo, a beam travelling from the interferometer IFMy toward the movable mirror MSy and reflected by the latter is denoted by B1y, and a beam travelling toward the fixed mirror MRy and reflected thereby is designated by B2y.

The optical path of the beam B2y for reference constituting the interferometer IFMy is covered with a prismatic fixed cover 10y, and the optical path of the beam B1y for measurement is covered with a prismatic movable cover (inner cylinder) 12y and the outer cover portion (outer cylinder) 11y for the interferometer of the fixed cover 10y. The movable cover 12y is provided for insertion and removal in the direction of the beam optical path in the outer cover 11y. However, the movement of the movable cover 12y in the direction of the beam optical path need be operatively associated with the movement of the wafer stage WST in Y direction and therefore, that end portion of the movable cover 12y which is opposed to the movable mirror MSy is mounted on a portion of the wafer stage WST through a holding member 13y. However, the wafer stage WST is moved also in X direction and therefore, the holding member 13y is provided for free movement in X direction along a guide portion 14y extended in X direction on a side of the stage WST.

More particularly, the fixed cover 10y is formed with such a length that covers substantially the whole of the optical path of the beam B2y travelling from the interferometer IFMy toward the fixed mirror MRy (or reflected therefrom)

via a beam splitter BSy a mirror M and a minute opening 9y. On the other hand, the movable cover 12y and the outer cover portion 11y are formed with such a length that covers substantially the whole of the optical path of the beam B1y travelling from the beam splitter BSy toward the movable mirror MSy (or reflected therefrom after passing through minute openings 8y. Further, the amount of movement between a position in which the movable cover 12y is most protruded and a position in which it is most retracted is substantially equal to the movement stroke of the wafer stage WST in Y direction.

As described above, covers are provided on the reference optical path (beams B2y, B2x) and the measurement optical path (beams B1y, B1x) of the laser interferometer and at the same time, a blast pipe 15y and a duct 16y for supplying temperature-controlled clean air into the respective covers are provided in a portion of the fixed cover 10y. The blast pipe 15y directs part of clean temperature-controlled gas made in an environmental chamber containing the exposing apparatus therein into the duct 16y. The duct 16y in turn supplies the temperature-controlled gas into the outer cover portion 11y and movable cover 12y through the fixed cover 10y. The temperature-controlled gas flows out from openings at the opposite ends (the mirror M side and the fixed mirror MRy side) of the fixed cover 10y and also flows out from the end opening of the movable cover 12y which is adjacent to the movable mirror MSy and the end opening of the outer cover portion 11y which is adjacent to the beam splitter BSy. The flow rate of the gas can be made markedly small as compared with a case where as in the prior art, air is blown against the optical path from a blast nozzle provided in an open space. Therefore, the amount of dust blown up by the gas flowing out of each cover can be reduced. For safety, an HEPA (high efficiency particle air) filter of 0.1 μm class may be placed in the duct 16y.

FIG. 2 is a fragmentary cross-sectional view of the structure of the covers shown in FIG. 1 as they are seen from the flank, and here is shown the cover structure of the interferometer optical path for X-axis which is not shown in FIG. 1. In FIG. 2, members similar to those shown in FIG. 1 are given similar reference characters.

Now, the wafer stage WST shown in FIG. 1 is, actually as shown in FIG. 2, comprised of a Y stage 18Y one-dimensionally movable on a base 20 in Y direction (a direction perpendicular to the plane of the drawing sheet of FIG. 2), an X stage 18X one-dimensionally movable on the Y stage 18Y in X direction, a ZL stage 17 finely movable for levelling and auto-focusing on the X stage 18X, and a wafer holder WH for finely moving a wafer W on the ZL stage about Z axis (the optical axis AX of the projection optical system PL). Further, the movable mirror MSx for X-axis is fixed to the circumference of the ZL stage 17, and on the reflecting surface thereof, a beam B1x for measurement is horizontally projected at substantially the same level as the surface of the wafer W.

Now, a fixed cover 10x is secured to a portion of a column 22 for holding the projection optical system PL, etc. through a fitting 21, and an outer cover portion 11x integral with the fixed cover 10x is fixed to a portion of the base 20 through a fitting 23. On the other hand, a movable cover 12x has its fore end mounted on a guide portion 14x on a side of the X stage 18x through a holding member 13x. The other end of the movable cover 12x is always contained in the outer cover portion 11x and is supported through a movable member 19 such as a vibration preventing roller or the like.

In such structure, temperature-controlled gas (air) passes through a duct 16x and each cover along flow paths as shown by arrows in FIG. 2 and flows outwardly. That is, part of the blast air flows through the fixed cover 10x toward the fore end thereof and flows out near the fixed mirror MRx, and the other part of the air flows out through the gap between the outer cover portion 11x and the movable cover 12x and also flows through the movable cover 12x toward the fore end thereof and flows out near the movable mirror MSx. As shown in FIGS. 1 and 2, small openings 9x and 8x for passing respective beams B2x and B1x therethrough are formed in the mirror M side of the fixed cover 10x (10y) and the beam splitter BSx (BSy) side of the outer cover portion 11x (11y), and some of the blast air flows out also from those small openings. However, it is preferable that the flow rate from these small openings be made small to the utmost.

Also, as shown in FIGS. 1 and 2, the temperature-controlled air ejected from the ducts 16x and 16y into the fixed covers 10x, 10y and the outer cover portions 11x, 11y is set so as to travel in a direction substantially parallel to the beams B1x, B2x, B1y and B2y and therefore, in the covers near the blast nozzle for the blast air, the air travels into the fixed covers 10x and 10y or the movable covers 12x and 12y while spirally turning around the beams B1x, B2x, B1y and B2y.

If as in the first embodiment, covers are provided on the optical paths of the beams B2x and B2y for reference travelling toward the fixed mirrors MRx and MRy, respectively, and the optical paths of the beams B1x and B1y for measurement travelling toward the movable mirrors MSx and MSy, respectively, and forcibly temperature-controlled gas is flowed into these covers, there is obtained the effect that the flow velocities of the gas in the covers become substantially uniform everywhere in proportion to the quantities of blast air from the ducts 16x and 16y.

Also, in the present embodiment, the temperature-controlled gas is always blown against the fixed mirrors MRx, MRy and the movable mirrors MSx, MSy and therefore, it becomes possible to positively cool the vicinity of the portions of the projection optical system PL on which the fixed mirrors are mounted and the vicinity of the portions of the ZL stage on which the movable mirrors are mounted, and the thermal unstable factor of the projection optical system and the wafer stage can also be reduced. This also leads to the obtainment of the secondary effect that the deterioration of the imaging performance by the amount of heat which is generated by the optical elements in the projection optical system absorbing part of exposure light being conducted to a lens barrel can be suppressed sufficiently small.

FIG. 3 shows the construction of an optical path cover according to a second embodiment of the present invention. This embodiment differs greatly from the first embodiment in that the movable cover is of multi-step structure.

That is, in the first embodiment, as is apparent from FIG. 2, the movement range of a movable cover 12x or 12y is the movement stroke of the wafer stage WST in X and Y directions and therefore, the dimensions of the movable covers 12x and 12y become great. So, in the second embodiment, as shown in FIG. 3, the movable cover is constructed of a two-step structure comprising a first movable cover 30x (30y with respect to an interferometer for Y-axis) having its fore end fixed to the wafer stage WST, and a second movable cover (intermediate cover) 31x (31y) linking the first movable cover 30x (30y) to an outer cover 11x (11y). The second movable cover 31x (31y) is retractilely constructed on the basis of the measured value of the wafer stage WST in X direction or Y direction by the interferometer, or ON or OFF of a limit switch provided on the stage, and is driven by an air cylinder, a belt pulley, etc., not shown.

Now, again in FIG. 3, members similar to those in FIG. 1 or 2 are given similar reference characters. As is apparent from FIG. 3, the first movable cover 30x (30y) is retractilely movable in the second movable cover 31x (31y), and is supported through a vibration preventing movable member (roller) 32. The second movable cover 31x (31y) is supported in the outer cover portion 11x (11y) through a movable member 33.

According to this second embodiment, the optical paths of beams B1x and B1y for measurement are covered with a retractile cover of multi-step structure and therefore, even if the space when the movable mirror on the wafer stage WST becomes closest to the beam splitter BS side is small, it will become possible to dispose a retractile cover easily.

FIG. 4 shows the construction of an optical path cover according to a third embodiment of the present invention. This embodiment differs from the first and second embodiments in that the dimensions, in the direction of the optical path, of a movable cover movable with the wafer stage WST are made small, and yet the retractile structure of the optical path cover for measurement is changed.

In FIG. 4, a short movable cover 40y (for X-axis, 40x) is provided under a fixed cover 10y (10x) and for movement in the direction of the optical path. Therefore, a guide rail, a driving belt, etc. are provided on the underside of the fixed cover 10y (10x), and the movable cover 40y (40x) is forcibly driven in conformity with the measured value by the interferometer so that the fore end thereof may keep a predetermined spacing with respect to the movable mirror MSy (MSx). Around the movable cover 40y, there are provided a plurality of openable-closable covers 41Y-1, 41Y-2, . . . , 41Y-7 provided on the lower portion of the side wall of the fixed cover 10y so as to be sideways openable by hinges or the like. These openable-closable covers 41Y are designed to be positioned above the upper surface of the movable mirror MSy when they are horizontally opened by 90° as shown in FIG. 4, and are successively opened like the covers 41Y-1 and 41Y-2 of FIG. 4 in response to the movement of the movable mirror MSy in the direction of the optical path, i.e., the movement of the movable cover 40y. Thus, all the openable-closable covers 41Y-1 to 41Y-7 are horizontally opened when the movable mirror MSy becomes closest to the outer cover portion 11y side. Also, a minute space is provided so that when the openable-closable covers 41Y are opened, the movable cover 40y may not slide on the inner walls thereof.

Although not shown in FIG. 4, openable-closable covers just identical to the openable-closable covers 41Y are also provided on the opposite side of the fixed cover 10y, and pairs of left and right openable-closable covers are opened or closed substantially at a time. The movable cover 40y, as in FIGS. 1 to 3, may be mounted on the guide portions 14x and 14y of the wafer stage WST through holding members 13x and 13y.

FIG. 5 shows a fragmentary cross-sectional view of the fixed cover 10x, 10y shown in FIGS. 1 to 4. A pipe duct 50 for passing temperature-controlled gas therethrough extending in the direction of the optical path is provided on the inner wall of the fixed cover 10x, 10y, and the temperature-controlled gas is passed through a flow path 51 inside this pipe duct 50 and further, a plurality of blast nozzles 52 are formed in a row in the side wall of the pipe duct 50. The air from the duct 16x, 16y shown in FIG. 1 or 2 is concentratively directed through the flow path 51 in the pipe duct 50.

Therefore, the air from the blast nozzles 52 is ejected so as to cross the whole of the beam optical path substantially from a direction perpendicular thereto. It is desirable that the air from each blast nozzle 52 be not ejected exactly perpendicularly to the beam optical path, but be obliquely ejected toward the fore end (fixed mirror MRx, MRy) side of the fixed cover 10x, 10y.

Figure 6:
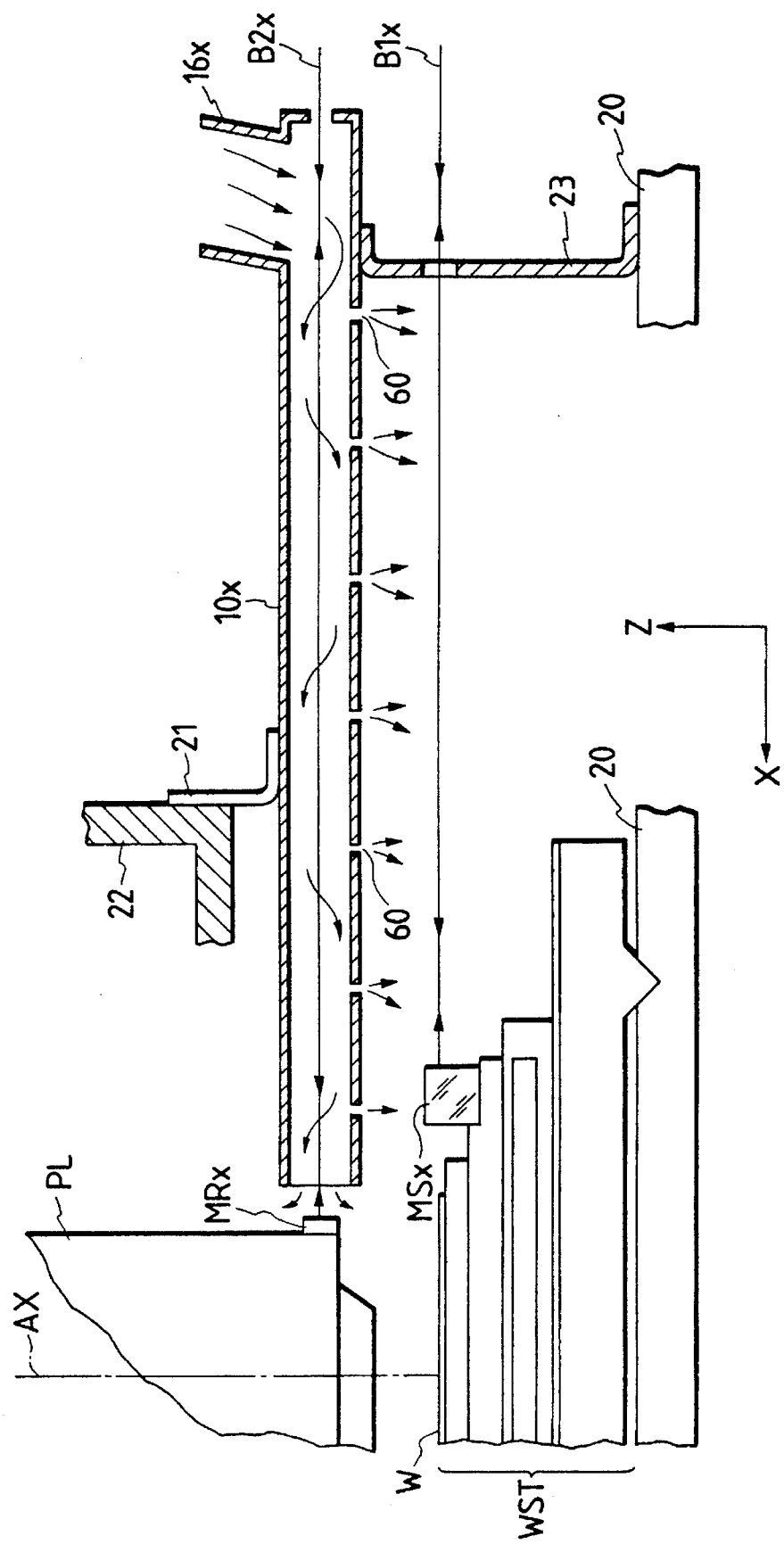
FIG. 6 is a fragmentary cross-sectional view showing the structure of the optical path cover of a light wave interferometer according to a fourth embodiment of the present invention.

FIG. 6 shows the construction of an optical path cover according to a fourth embodiment of the present invention. This embodiment differs from the previous embodiments in that a cover is provided only for the beam optical path for reference for the fixed mirror MR and no special cover is provided for the beam optical path for measurement for the movable mirror MS. In FIG. 6, members similar to those in FIGS. 1 and 2 are given similar reference characters.

In FIG. 6, the fixed cover 10x (for Y-axis, 10y) are fixed to a column 22 and a base 20 through fittings 21 and 23, respectively. As in the previous embodiment, a duct 16x is provided in the fixed cover 10x, and clean temperature-controlled air passes through the fixed cover 10x and flows out from the fixed mirror MRx side. Further, a plurality of small openings 60 (minute holes) for ejecting the temperature-controlled air therethrough toward the optical path of the beam B1x for measurement are formed substantially in a row in the underside portion of the fixed cover 10x.

In FIG. 6, the underside of the fixed cover 10x and the upper surface of the movable mirror MSx are shown so as to have a relatively great spacing therebetween, but this spacing can be of the order of several mm to 1 cm. Therefore, the spacing between the small openings 60 and the beam B1x can be about 1 cm and thus, air of a great flow velocity is blown against the optical path of the beam B1x in a direction substantially perpendicular thereto.

The present embodiment adopts the conventional idea that in an open space, air is blown against the beam optical path for measurement. However, it has been confirmed by experiments that this is much more effective than the conventional system. It is because just near the beam optical path for measurement, the blast nozzles (small openings 60) for the temperature-controlled gas are arranged along the optical path, whereby utilization can be made of the gas in a state in which the flow velocity near the blast nozzles is great. Accordingly, even if the flow rate per unit time of the air supplied from the ducts 16x and 16y is small, the flow velocity near the small openings 60 can be made great if a construction for effectively ejecting the air from the small openings 60 is adopted.

Figure 7:
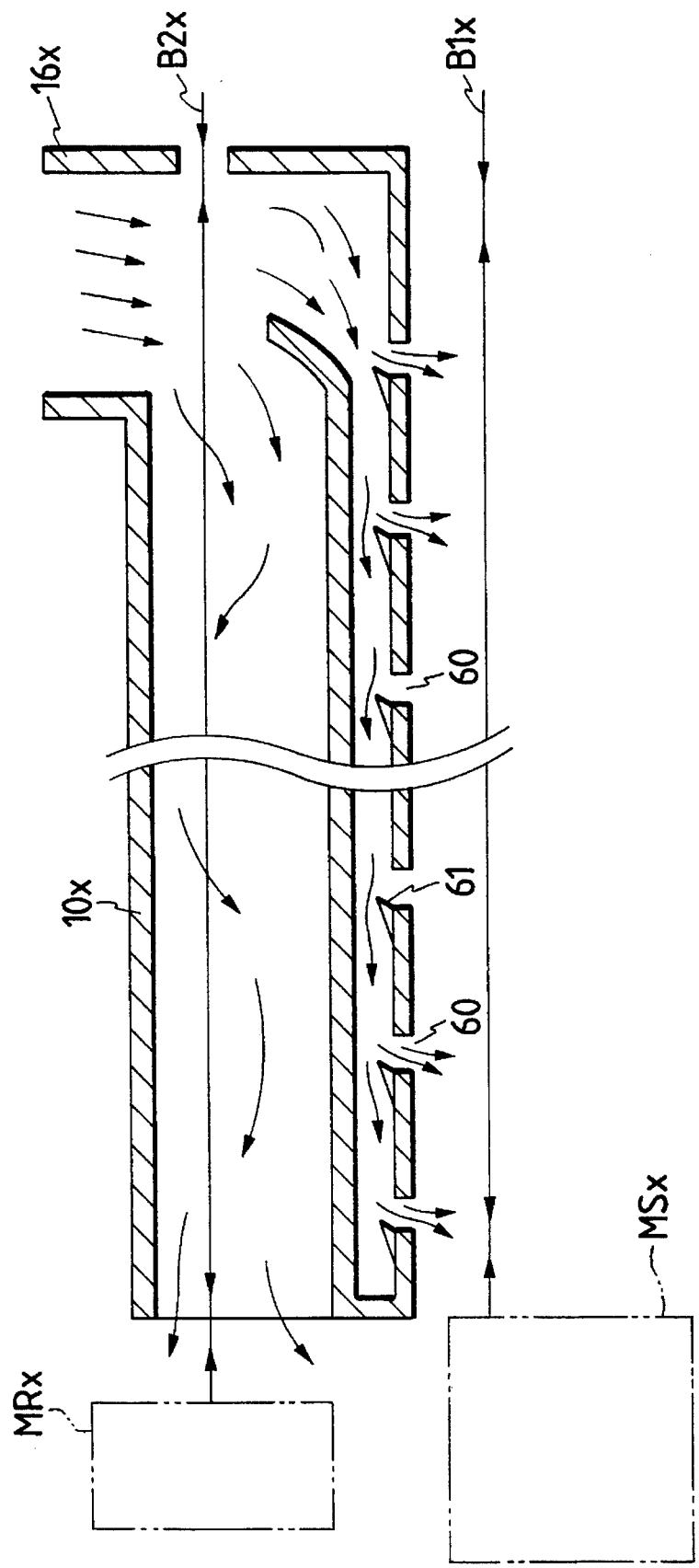
FIG. 7 is a cross-sectional view showing a modification of the optical path cover structure of FIG. 6.

Also, the structure of the fixed cover 10x shown in FIG. 6 may be combined with the structure shown in FIG. 5 to thereby provide a cover construction as shown in FIG. 7. In FIG. 7, the interior of the fixed cover 10x is made into two-layer structure, and the blast air from the duct 16x is divided into an upper-stage cover covering the optical path of the beam B2x for reference and a lower-stage cover formed with a plurality of small openings 60 for air blast. On the inner wall of the lower-stage cover on the leeward side of each small opening, there is provided an air directing plate (flange) 61 for effectively directing the gas passing through the lower-stage cover to the small opening 60. According to the embodiment of FIGS. 6 and 7, there is no movable member moving in response to the movement of the movable mirrors MSx and MSy and therefore, the creation of dust which could not necessarily be avoided by adopting movable structure can be prevented.

Moreover, some of the clean temperature-controlled gas ejected into the fixed cover air-conditions the beam optical path for measurement very efficiently and thus, the stability of measurement is improved to the same degree as in the previous embodiments.

Figure 8:
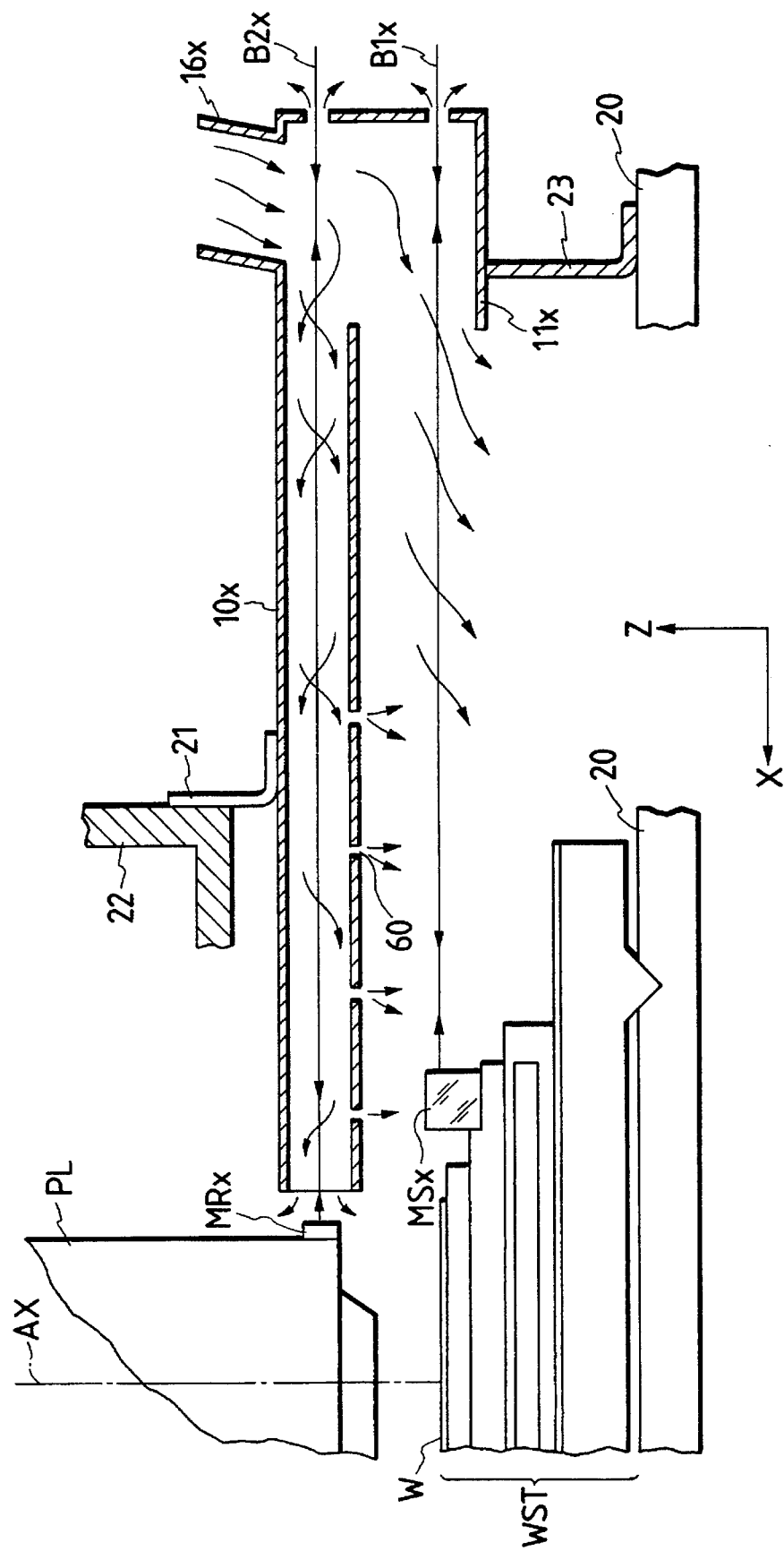
FIG. 8 is a fragmentary cross-sectional view showing the structure of the optical path cover of a light wave interferometer according to a fifth embodiment of the present invention.

FIG. 8 shows the construction of an optical path cover according to a fifth embodiment of the present invention in which the construction shown in FIG. 6 is somewhat modified. As shown in FIG. 8, in the present embodiment, a part of the beam B1x (B1y) for measurement which is adjacent to the beam splitter is covered with an outer cover portion 11x (11y) so that the air from a duct 16x may be efficiently concentrated on that portion of the optical path of the beam B1x which is adjacent to the beam splitter by the outer cover portion 11x. The outer cover portion 11x is made so as not to spatially interfere with the stage within the range of the movement stroke of the wafer stage WST. In the position as shown in FIG. 8 wherein the wafer stage WST is far from the interferometer IFX, the beam splitter, etc., the air from a plurality of small openings 60 formed in the underside of the fixed cover 10x positively temperature-controls the optical path of the beam B1x for measurement. For this purpose, the small openings 60 are formed in a row at predetermined intervals in about one half of the underside of the fixed cover 10x which is adjacent to the fore end thereof.

Figure 9:
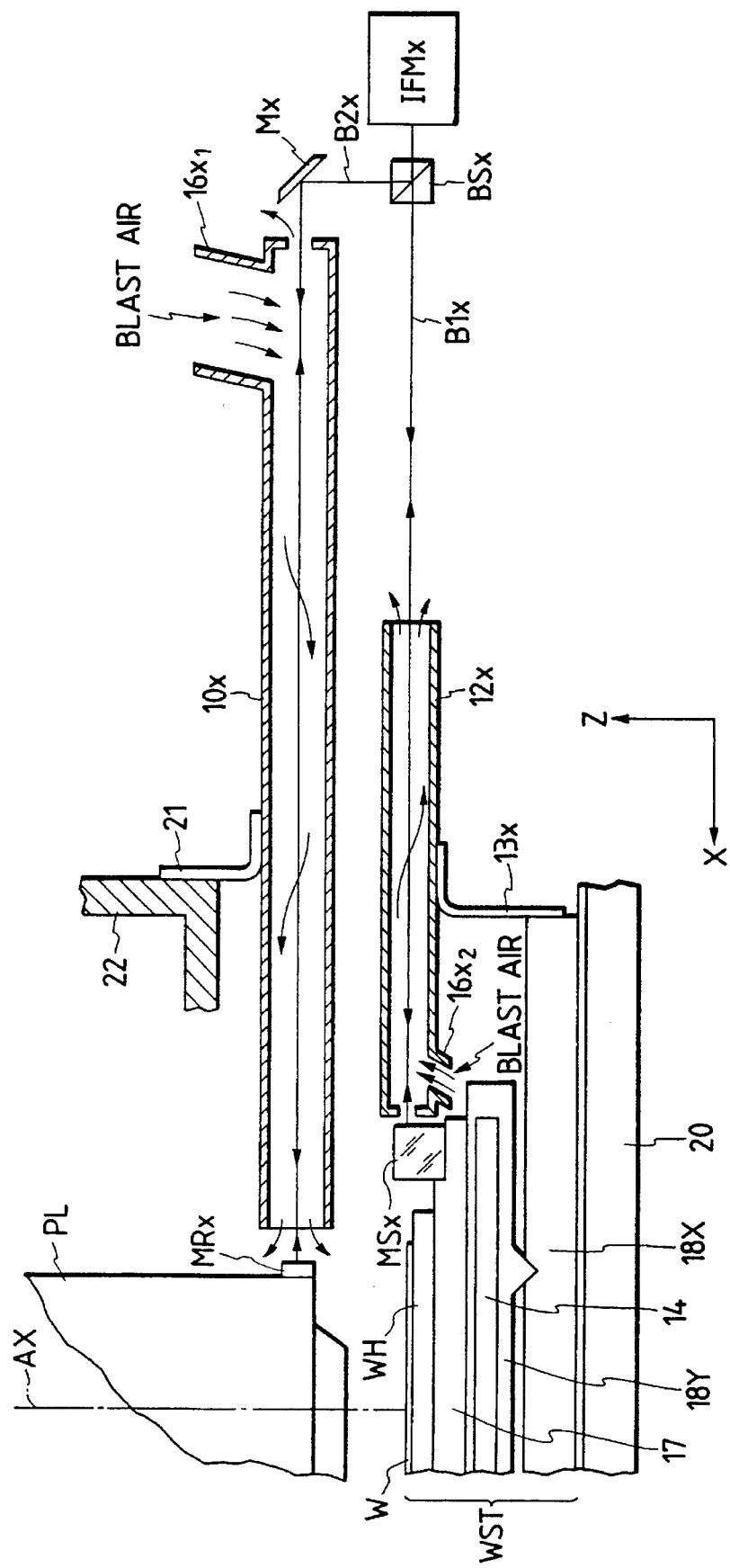
FIG. 9 is a fragmentary cross-sectional view showing the structure of the optical path cover of a light wave interferometer according to a sixth embodiment of the present invention.
Figure 10:
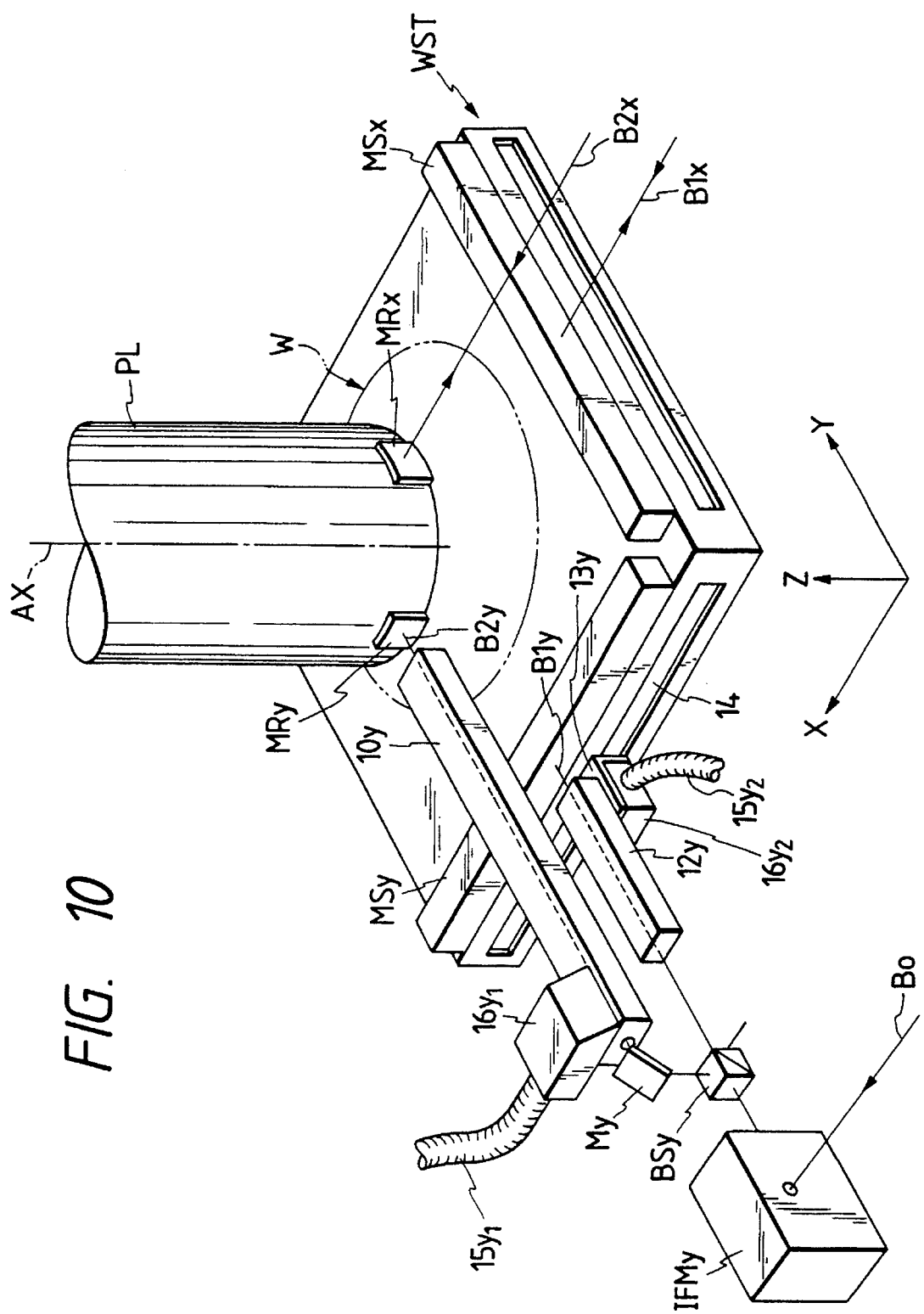
FIG. 10 is a perspective view showing the construction of a stage provided with the light wave interferometer according to the sixth embodiment of the present invention.

FIGS. 9 and 10 show the construction of the optical path cover of a position measuring apparatus according to a sixth embodiment of the present invention. FIG. 9 is a fragmentary cross-sectional view showing the construction of a laser interferometer IFMx for X-axis in detail, and FIG. 10 is a perspective view showing the general construction of the position measuring apparatus according to the present embodiment, and particularly shows the detailed construction of a laser interferometer IFMy for Y-axis. In FIG. 10, the laser interferometer IFMx for X-axis is not shown, and only beams B1x and B2x travelling toward the movable mirror MSx and fixed mirror MRx for X-axis are shown. In FIGS. 9 and 10, members functionally similar to those in FIG. 14 are given similar reference characters.

An orthogonal coordinates system XYZ is defined as shown in FIG. 10, and it is to be understood that the optical axis AX of the projection optical system PL is parallel to Z-axis, the reflecting surfaces of the movable mirror MSy and fixed mirror MRy are disposed so as to be parallel to X–Z plane, and the reflecting surfaces of the movable mirror MSx and fixed mirror MRx are disposed so as to be parallel to Y–Z plane. Also, a beam from a laser source (not shown) for the interferometer is designated by Bo, a beam travelling from the interferometer IFMy toward the movable mirror MSy and reflected by the latter is denoted by B1y, and a beam travelling toward the fixed mirror MRx and reflected thereby is designated by B2y. The wafer stage WST shown in FIG. 10 is similar in construction to that in the first embodiment shown in FIG. 1.

Now, as shown in FIG. 9, the optical path of a beam B2x for reference emerging from the interferometer IFMx and travelling toward (or reflected from) the fixed mirror MRx via a beam splitter BSx and a mirror Mx has substantially its whole (the optical path between the mirror Mx and the fixed mirror MRx) covered with a prismatic fixed cover 10x. Further, the fixed cover 10x is secured to a portion of a column 22 for holding the projection optical system PL, etc., through a holding member (fitting) 21. At this time, it is to be understood that the spacing between one end (the left side in the plane of the drawing sheet) of the fixed cover 10x and the fixed mirror MRx and the spacing between the other end (the right side in the plane of the drawing sheet) of the fixed cover 10x and the mirror Mx are both determined to a minute value.

On the other hand, the optical path of a beam B1x for measurement transmitted through the beam splitter BSx and travelling toward (or reflected from) the movable mirror MSx has only its part near the movable mirror MSx covered with a prismatic fixed cover 12x. The fixed cover 12x need be operatively associated with (follow) the movement of the X stage 18X so that one end thereof may be always disposed closely adjacent to the movable mirror MSx and therefore, it is secured to a portion of the X stage 18X through a holding member (fitting) 13x. Further, the fixed cover 12x is formed with such a degree of length that a portion thereof does not contact (collide) with the beam splitter BSx when the X stage 18X is moved most rightwardly in the plane of the drawing sheet.

As described above, the fixed covers 10x and 12x are provided on the reference optical path (beam 132x) and measurement optical path (beam B1x), respectively, of the laser interferometer, and a blast pipe (not shown) and a duct for supplying temperature-controlled clean air to the interiors of the fixed covers 10x and 12x are provided on a portion of the fixed cover 10x and a portion of the fixed cover 12x, respectively. Although not shown in FIG. 1, the blast pipe (similar to blast pipes $15y_1$ and $15y_2$ in FIG. 10 which will be described later) is for directing to ducts $16x_1$ and $16x_2$ part of clean temperature-controlled gas (blast air) made in the environmental chamber containing the exposing apparatus therein.

Also, the duct $16x_1$ supplies temperature-controlled gas to the interior of the fixed cover 10x, and most of this temperature-controlled gas flows through the cover toward the fixed mirror MRx as indicated by arrows in FIG. 9 and flows outwardly from the end openings (full openings) arranged in proximity to the fixed mirror MRx, and the remaining part of the temperature-controlled gas flows outwardly from small openings (of a size corresponding to the beam diameter and the mounting error of the cover) at the other end (adjacent to the mirror Mx). On the other hand, most of the temperature-controlled gas supplied to the interior of the fixed cover 12x by the duct $16x_2$ flows through the cover toward the fore end thereof (adjacent to the beam splitter BSx) as indicated by arrows in FIG. 9 and flows outwardly from the end opening (full opening) thereof and the remaining part of the temperature-controlled gas flows outwardly from a small opening (of a size corresponding to the beam diameter and the mounting error of the cover and proximate to the movable mirror MSx) at the other end (adjacent to the movable mirror MSx).

The laser interferometer IFMy for Y-axis will now be described with reference to FIG. 10. The difference between the laser interferometer IFMx for X-axis and the laser interferometer IFMy for Y-axis is only that the former interferometer is movable in X direction relative to the wafer stage WST so that the fixed cover 12y covering the measurement optical path (beam B1y) of the laser interferometer IFMy may not positionally deviate relative to the fixed cover 10y covering the reference optical path (beam B2y) even if the wafer stage WST is moved in X direction. In the other points, the two interferometers are the same and therefore will be described briefly herein.

Now, as shown in FIG. 10, the optical path of the beam B2y for reference emerging from the interferometer IFMy and travelling toward (or reflected from) the fixed mirror MRy via the beam splitter BSy and mirror My has substantially its whole (the optical path between the mirror My and the fixed mirror MRy) covered with a prismatic fixed cover 10y. Although not shown, the fixed cover 10y is also secured to a portion of a column 22 for holding the projection optical system PL, etc., through a fitting.

On the other hand, the optical path of the beam B1y for measurement transmitted through the beam splitter BSy and travelling toward (or reflected from) the movable mirror MSy has only a part thereof near the movable mirror MSy covered with a prismatic fixed cover 12y. The fixed cover 12y need be operatively associated with (follow) the movement of the wafer stage WST, i.e., the Y stage 18Y, so that one end thereof may always be disposed closely adjacent to the movable mirror MSy and therefore, it is mounted on a portion of the Y stage 18Y through a fitting 13y.

However, the Y stage 18Y is placed on the X stage 18X and is moved also in X direction with the movement of this X stage 18X and therefore, the fitting 13y is provided for free movement in X direction along a guide surface 14 extended on a side of the wafer stage WST (Y stage 18Y) in X direction. Although not shown, the fixed cover 12y is designed to be moved along the fixed cover 10y by a holding member when the wafer stage WST is moved in Y direction, and to be moved along the guide surface 14 so as not to positionally deviate relative to the fixed cover 10y when the wafer stage WST is moved in X direction. Also, the fixed cover 12y is set to such a degree of length that it will not contact (collide) with the beam splitter BSy even if the wafer stage WST (Y stage 18Y) is moved.

Further, blast pipes $15y_1$, $15y_2$ and ducts $16y_1$, $16y_2$ for supplying temperature-controlled clean air to the interiors of the fixed covers 10y and 12y, respectively, are provided on portions of the fixed covers 10y and 12y, respectively. The blast pipes $15y_1$ and $15y_2$ are for directing to the ducts $16y_1$ and $16y_2$, respectively, part of the clean temperature-controlled gas made in the environmental chamber containing the apparatus therein. Most of the temperature-controlled gas supplied to the interior of the fixed cover 10y by the duct $16y_1$ flows through the cover toward the fixed mirror MRy and flows outwardly from the end opening (full opening) proximate to the fixed mirror MRy. On the other hand, most of the temperature-controlled gas supplied to the interior of the fixed cover 12y by the duct $16y_2$ flows through the cover toward the beam splitter BSy and flows outwardly from the end opening thereof (full opening).

Now, the flow rates in the fixed covers 10x, 10y and 12x, 12y can be made markedly small as compared with a case where as in the prior art, a blast nozzle is provided in an open space and air is blown against an optical path. Therefore, the dust blown up by the gas flowing outwardly from each cover is also reduced. For safety, an HEPA (high efficiency particle air) filter of 0.1 μm class may be provided in each of the ducts $16x_1$, $16x_2$ and $16y_1$, $16y_2$. Also, small openings for passing the beams B1x, B2x, B1y and B2y therethrough are formed in those end portions of the fixed covers 10x, 10y and fixed covers 12x, 12y which are adjacent to the mirrors Mx, My and movable mirrors MSx, MSy, respectively, and as described above, part of the blast air flows outwardly from those small openings as well, but it is preferable that the flow rates from these small openings be made small to the utmost.

Further, in the fixed covers 10x and 10y, the temperature-controlled gas is made to flow from the mirrors Mx and My toward the fixed mirrors MRx and MRy, but alternatively, the temperature-controlled gas may be made to flow in the opposite direction, i.e., from the fixed mirrors toward the mirrors. Also, in the present embodiment, the interferometer for X-axis and the interferometer for Y-axis are of the same construction with the exception that the fixed cover 12y is movable in X direction, but for example, the interferometer for X-axis may be of just the same construction as in the above-described embodiment and the construction of the interferometer for Y-axis may be changed. Specifically, the fixed cover 10y covering the optical path of the reference beam B2y for the fixed mirror may be made into just the same construction as in the above-described embodiment, and the fixed cover covering the optical path of the measurement beam B1y for the movable mirror, conversely from the above-described embodiment, may be disposed so as to cover only a part of the optical path which is near the beam splitter BSy, and may be provided integrally with the fixed cover 10y and may be designed such that in the cover, the temperature-controlled gas is flowed toward the movable mirror MSy. In such case, the guide surface of the fitting for moving the fixed cover 12y need not be formed on the wafer stage WST, and this leads to the advantage that the construction of the wafer stage can be simplified. As shown in FIGS. 9 and 10, the temperature-controlled gas supplied from the ducts $16x_1$, $16x_2$, $16y_1$, $16y_2$ to the fixed covers 10x, 10y, 12x, 12y is set so as to travel in a direction substantially perpendicular to the beams B2x, B2y, B1x, B1y. Thus, in the cover near the blast nozzle for the temperature-controlled gas, the gas travels through the interiors of the fixed covers 10x, 10y, 12x and 12y while spirally turning around the beams B1x, B2x, B1y and B2y.

As described above, in the present embodiment, a cover is provided on each of the optical paths of the beams B2x and B2y for reference travelling toward the fixed mirrors MRx and MRy, respectively, and the optical paths of the beams B1x and B1y for measurement travelling toward the movable mirrors MSx and MSy, respectively, and there is obtained the effect that when forcibly temperature-controlled gas is flowed into each cover, the flow velocity of the gas in the cover becomes substantially uniform everywhere in the cover in proportion to the quantity of blast air from the duct. Further, in the present embodiment, only those parts of the optical paths of the beams B1x and B1y for measurement travelling toward the movable mirrors MSx and MSy, respectively, which are near the movable mirrors particularly greatly affected by fluctuation are covered with the covers 12x and 12y, and design is made such that in each cover, the temperature-controlled gas is flowed from the movable mirror toward the beam splitter. Therefore, there is obtained the effect that the apparatus itself is not made bulky and complicated and moreover, the fluctuation of the low frequency component becomes substantially null.

Figure 11:
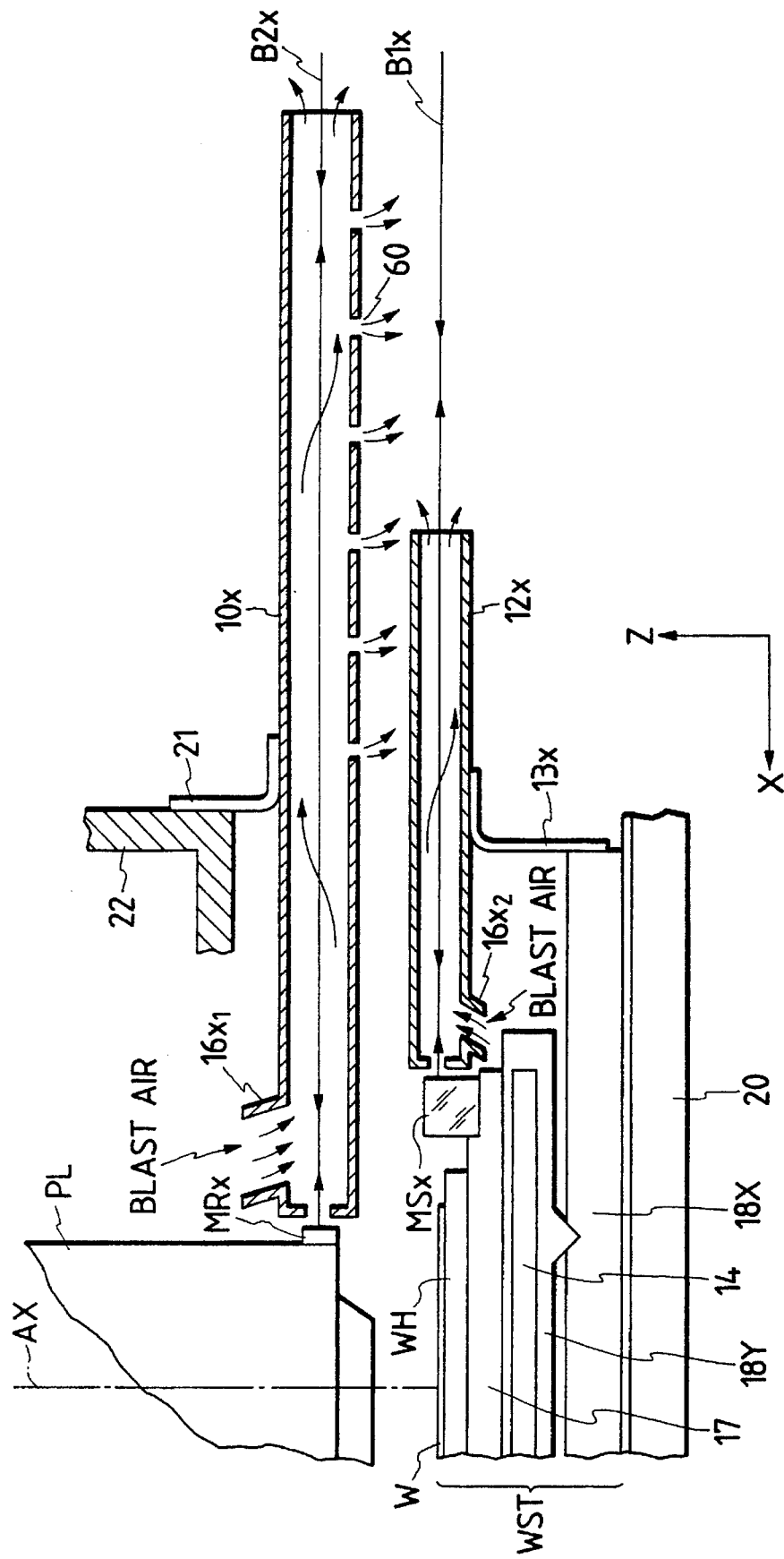
FIG. 11 is a fragmentary cross-sectional view showing the structure of the optical path cover of a light wave interferometer according to a seventh embodiment of the present invention.

FIG. 11 shows the construction of an optical path cover according to a seventh embodiment of the present invention. The difference of this embodiment from the sixth embodiment is that in the interior of the fixed cover 10x covering the beam B2x for reference, blast air is flowed from the fixed mirror MRx toward the mirror Mx and a plurality of small openings are formed in a row in the underside of the cover 10x. Accordingly, the present embodiment will hereinafter be described with respect only to this difference. Also, the laser interferometer for X-axis and the laser interferometer for Y-axis are of the same construction with the exception that the fitting By is movable and therefore, only the laser interferometer for X-axis will be described here. In FIG. 11, members similar to those in FIG. 9 are given similar reference characters.

In FIG. 11, a duct $16x_1$ for supplying temperature-controlled gas (blast air) into the fixed cover 10x covering the optical path of the beam B2x for reference is provided near the fixed mirror MRx of the fixed cover 10x, and the clean blast air passes through the interior of the fixed cover 10x and flows outwardly from the opening thereof adjacent to the mirror Mx, as indicated by arrows in FIG. 11. Further, a plurality of small openings for ejecting the blast air therethrough toward the optical path of the beam B1x for measurement are formed in a row in the underside of the fixed cover 10*x*. In FIG. 11, the spacing between the underside of the fixed cover 10*x* and the beam B1*x* for measurement is shown as being relatively great, but this spacing can be of the order of several mm to 1 cm. Accordingly, by narrowing said spacing, it becomes possible to blow air of a great flow velocity against the optical path of the beam B1*x*.

As described above, in the present embodiment, blast nozzles (small openings 60) for the blast air are arranged just near the optical path of the beam B1*x* for measurement and along this optical path, whereby temperature-controlled gas near the blast nozzles which is great in flow velocity can also be blown against particularly that portion of the optical path of the beam B1*x* for measurement which is not covered with the fixed cover 12*x*. As a result, the fluctuation of the low frequency component can be more reduced and the accuracy of the position measurement by the interferometer can be improved.

The number of and the spacing between the small openings in the underside of the fixed cover 10*x* may be arbitrary, and it is desirable to set the number of and the spacing between the small openings so that the temperature-controlled gas may be blown against substantially the whole area of the beam optical path which is not covered with the fixed cover 12*x* even when in FIG. 11, the wafer stage WST is moved most leftwardly. Also, on the inner wall of the fixed cover 10*x*, an air directing plate (flange) for effectively directing the temperature-controlled gas flowing through the interior of the cover 10*x* may be provided adjacent to each small opening and on the leeward side thereof.

Figure 12:
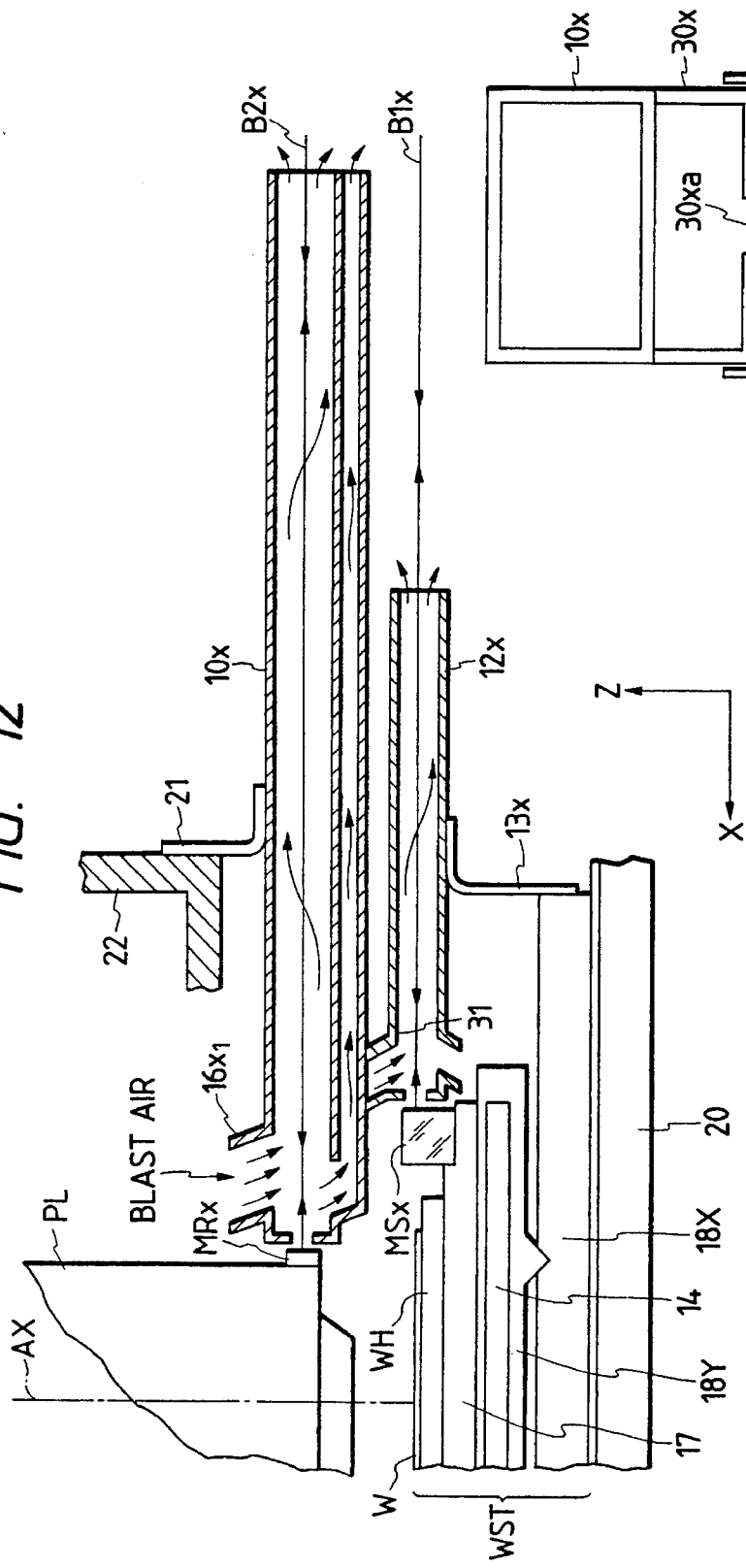
FIG. 12 is a fragmentary cross-sectional view showing the structure of the optical path cover of a light wave interferometer according to an eighth embodiment of the present invention.
Figure 13:
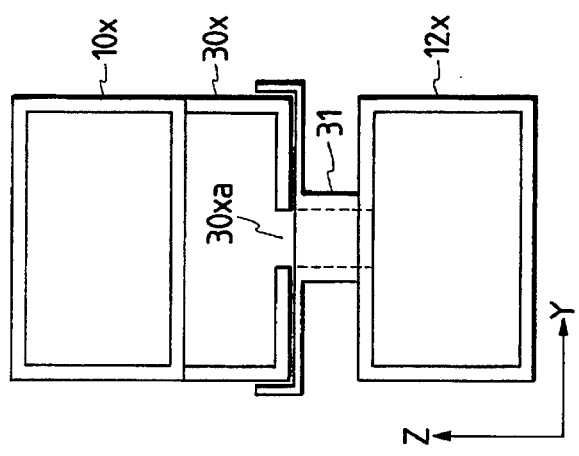
FIG. 13 shows the optical path cover of FIG. 12 as it is seen from the flank.

FIG. 12 shows the construction of an optical path cover according to an eighth embodiment of the present invention. The difference of this embodiment from the seventh embodiment is that an auxiliary cover 30*x* is provided on the underside of the fixed cover 10*x* and part of temperature-controlled gas flowing from the duct 16*x*₁ into the fixed cover 10*x* is directed into the interior of the fixed cover 12*x*. FIG. 13 shows the optical path cover of FIG. 12 as it is seen from the interferometer side (the right in the plane of the drawing sheet of FIG. 12).

In FIG. 12, the fixed cover 10*x* covering the optical path of the beam B2*x* for reference is made into two-layer structure, that is, the auxiliary cover 30*x* is provided on the underside of the fixed cover 10*x*, and the temperature-controlled gas flowing thereinto from the duct 16*x*₁ is divided into the upper-stage cover 10*x* covering the optical path of the beam B2*x* for reference and the lower-stage auxiliary cover 30*x* provided on the underside thereof. Further, an opening 30*xa* (FIG. 13) extending along the optical path of the beam B1*x* for measurement (or the beam B2*x* for reference) and over the whole area of the cover 30*x* is formed in the underside of the auxiliary cover 30*x*.

Also, an air directing member 31 for directing the temperature-controlled gas which has flowed into the auxiliary cover 30*x* into the fixed cover 12*x* is provided on the upper surface portion of the fixed cover 12*x* (the end portion thereof adjacent to the movable mirror MS*x*) covering the optical path of the beam B1*x* for measurement, and the temperature-controlled gas which has flowed into the fixed cover 12*x* passes through the interior thereof and flows outwardly from the end surface (full opening) adjacent to the beam splitter BS*x*. Further, the air directing member 31 is connected to the fixed cover 10*x* so as to be able to follow the movement of the X stage 18X and move in the direction of the optical path.

As described above, the present embodiment has the advantage that only one set of blast pipe and duct is required for directing the temperature-controlled gas into the fixed covers 10*x* and 12*x*. In the present embodiment, the auxiliary cover 30*x* is provided with the blast stability and flow rate of the temperature-controlled gas in the fixed cover 10*x* taken into account, but alternatively, an opening may be formed in the underside of the fixed cover 10*x* and the air directing member 31 may be directly connected to the cover 10*x*.

While various embodiments of the present invention have been described above, the present invention can also be applied to an apparatus having other two-dimensional or one-dimensional stage in which the laser interferometer is a length measuring machine. The present invention can also be applied to a system in which the reference beam for the fixed mirror and the measurement beam for the movable mirror are not parallel to each other. Further, the fixed covers 10*x* and 10*y* are designed to cover the portions of the optical paths of the reference beams B2*x* and B2*y* for the fixed mirrors which are between the mirrors M*x*, M*y* and the fixed mirrors MR*x*, MR*y*, but alternatively, they may be designed to cover, for example, substantially all of the optical paths between the beam splitters BS*x*, BS*y* and the fixed mirrors MR*x*, MR*y*.

What is claimed is:

1. A position measuring apparatus for detecting a position of a stage movable in a predetermined direction on a base, comprising:

a movable mirror having a reflecting surface perpendicular to the direction of movement of said stage and mounted on a portion of said stage;

a fixed mirror disposed fixedly relative to said base;

a light wave interferometer projecting coherent light beams substantially perpendicularly to respective ones of said movable mirror and said fixed mirror, causing the light beams reflected by respective ones of said movable mirror and said fixed mirror to interfere with each other and receiving said light beams, and photoelectrically detecting said interference beams and outputting a measurement signal;

a position detecting circuit for detecting the position of said stage based on said measurement signal;

first cover means covering a beam optical path from said light wave interferometer to said fixed mirror;

second cover means covering a beam optical path from said light wave interferometer to said movable mirror, said second cover means having its dimension in the direction of said beam optical path variable with the movement of said stage; and gas supply means for supplying gas of controlled temperature to interiors of said first cover means and said second cover means at a predetermined flow rate.

2. A position measuring apparatus according to claim 1, wherein said first cover means is a tube through which said light beam passes and which has a length substantially equal to the length of the optical path of said light beam, said tube having a first end portion located on said interferometer side and a second end portion proximate to said fixed mirror, said first end portion having a minute opening through which said light beam passes, said second end portion having a large opening, and said gas supply means communicates with said tube near said first end portion, whereby said gas supply means flows said gas of controlled temperature outwardly through said large opening.

3. A position measuring apparatus for detecting a position of a stage movable in a predetermined direction on a base, comprising:

a movable mirror having a reflecting surface perpendicular to the direction of movement of said stage and mounted on a portion of said stage;

a fixed mirror disposed fixedly relative to said base;

a light wave interferometer projecting coherent light beams substantially perpendicularly to respective ones of said movable mirror and said fixed mirror, causing the light beams reflected by respective ones of said movable mirror and said fixed mirror to interfere with each other and receiving the reflected light beams, and photoelectrically detecting said interference beams and outputting a measurement signal;

a position detecting circuit for detecting the position of said stage based on said measurement signal;

cover means covering a beam optical path from said light wave interferometer to said fixed mirror, said cover means being invariable in its dimension in the direction of said beam optical path; and gas supply means for supplying gas of controlled temperature to an interior of said cover means at a predetermined flow rate.

4. A position measuring apparatus according to claim 3, wherein said cover means is a tube through which said light beams pass and which has a length substantially equal to a length of the optical path of said light beams, said tube having a first end portion located on said interferometer side and a second end portion proximate to said fixed mirror, said first end portion having a minute opening through which said light beams pass, said second end portion having a large opening, and said gas supply means communicates with said tube near said first end portion, whereby said gas supply means flows said gas of controlled temperature outwardly through said large opening.

5. A position measuring apparatus according to claim 4, wherein the light beam travelling toward said fixed mirror and the light beam travelling toward said movable mirror are applied in parallelism, the side of said tube has a plurality of minute holes formed along the light beam travelling toward said movable mirror, and part of said gas of controlled temperature supplied into said tube is supplied substantially perpendicularly to the light beam travelling toward said movable mirror through said minute holes.

6. A position measuring apparatus for detecting a position of a stage movable in a predetermined direction on a base, comprising:

a movable mirror having a reflecting surface perpendicular to the direction of movement of said stage and mounted on a portion of said stage;

a fixed mirror disposed fixedly relative to said base;

a light wave interferometer projecting coherent light beams substantially perpendicularly to respective ones of said movable mirror and said fixed mirror, causing the light beams reflected by respective ones of said movable mirror and said fixed mirror to interfere with each other and receiving the reflected light beams, and photoelectrically detecting the interference beams and outputting a measurement signal;

a position detecting circuit for detecting the position of said stage based on said measurement signal;

first cover means covering a beam optical path from said light wave interferometer to said fixed mirror;

second cover means covering a part of a beam optical path from said light wave interferometer to said movable mirror which is near said movable mirror; and gas supply means for supplying gas of controlled temperature to interiors of said first cover means and said second cover means at a predetermined flow rate, and flowing said gas of controlled temperature within said second cover means from said movable mirror toward said light wave interferometer.

7. A position measuring apparatus according to claim 6, further comprising means for moving said second cover means with said stage when said stage is moved in the direction of said beam optical path, and stopping said second cover means relative to said beam optical path when said stage is moved in a direction orthogonal to the direction of said beam optical path.

* * * * *